(12) United States Patent
Lee et al.

(10) Patent No.: US 10,985,754 B1
(45) Date of Patent: Apr. 20, 2021

(54) INPUT/OUTPUT CIRCUIT AND ELECTRONIC DEVICE INCLUDING THE SAME

(71) Applicant: DB HiTek Co., Ltd., Seoul (KR)

(72) Inventors: Sang Mok Lee, Incheon (KR); Joon Tae Jang, Seoul (KR); Seung Hoo Kim, Bucheon-si (KR)

(73) Assignee: DB HiTek Co., Ltd., Seoul (KR)

( * ) Notice: Subject to any disclaimer, the term of this patent is extended or adjusted under 35 U.S.C. 154(b) by 0 days.

(21) Appl. No.: 16/884,694

(22) Filed: May 27, 2020

(51) Int. Cl.
*H03K 17/687* (2006.01)

(52) U.S. Cl.
CPC ............... *H03K 17/6872* (2013.01)

(58) Field of Classification Search
CPC ...... H03K 17/10; H03K 17/12; H03K 17/687; H03K 17/6871; H03K 17/6872
USPC .................................................. 327/108–112
See application file for complete search history.

(56) References Cited

U.S. PATENT DOCUMENTS

| | | | | |
|---|---|---|---|---|
| 5,920,210 A | * | 7/1999 | Kaplinsky | H03K 3/3565 326/21 |
| 8,633,737 B2 | * | 1/2014 | Wang | H03K 19/00361 327/108 |
| 2010/0253392 A1 | * | 10/2010 | Ker | H03K 3/0375 327/108 |
| 2018/0342941 A1 | * | 11/2018 | Chang | H03K 17/162 |

* cited by examiner

*Primary Examiner* — John W Poos
(74) *Attorney, Agent, or Firm* — Andrew D. Fortney; Central California IP Group, P.C.

(57) ABSTRACT

An input/output circuit includes a logic unit configured to generate a first signal and a second signal based on data and a first control signal, a driver including a first PMOS transistor having a first gate, a first source that receives a first voltage from a first voltage source, and a first drain, and a first NMOS transistor having a second gate that receives the second signal, a second source that receives a second voltage from a second voltage source less than the first voltage, and a second drain connected to the first drain, a gate-tracking circuit configured to receive the first signal and transfer the received first signal to the first gate of the first PMOS transistor based on a second control signal, and an input/output terminal connected to the first drain and the second drain.

18 Claims, 5 Drawing Sheets

INPUT/OUTPUT CIRCUIT AND ELECTRONIC DEVICE INCLUDING THE SAME

BACKGROUND OF THE INVENTION

Field of the Invention

Embodiments of the present invention relate to an input/output circuit and an electronic device including the same.

Discussion of the Related Art

An input/output circuit of an electronic device may function as an electrical interface between an internal circuit of the electronic device and an external circuit outside of the electronic device. The input/output circuit of the electronic device may transmit or receive a voltage and/or signal from or to the internal circuit and/or the external circuit.

The input/output circuit of the electronic device may be useful in the case where electrical isolation is provided between the internal circuit and the external circuit or in the case where the internal circuit operates at a voltage level different from that of the external circuit.

In general, the input/output circuit may include an output driver acting as an output circuit. The output driver may use drain voltage characteristics of a PMOS transistor and an NMOS transistor. A ground voltage may be provided as a P-well bias to the NMOS transistor, and a supply voltage may be provided as an N-well bias to the PMOS transistor.

SUMMARY OF THE INVENTION

Accordingly, the present invention is directed to an input/output circuit and an electronic device including the same that substantially obviate one or more problems due to limitations and disadvantages of the related art.

An object of embodiments of the present invention is to provide an input/output circuit which is capable of receiving a signal having a voltage greater than or equal to a breakdown voltage of an element of a logic unit (e.g., in the input/output circuit or the internal circuit operably connected to the input/output circuit) through an input/output terminal (e.g., electrically connected to the input/output circuit) and, when the voltage greater than an operating voltage (e.g., received by the input/output circuit or the internal circuit operably connected to the input/output circuit) is applied to the input/output terminal, preventing current leakage and protecting the element of the logic unit, and an electronic device including the same.

Additional advantages, objects, and features of the invention will be set forth in part in the description that follows and in part will become apparent to those skilled in the art upon examination of the following or may be learned from practice of the invention. The objectives and other advantages of the invention may be realized and attained by the structure(s) particularly pointed out in the written description and claims hereof as well as the appended drawings.

To achieve these objects and other advantages and in accordance with the purpose(s) of the invention, as embodied and broadly described herein, an input/output circuit according to various embodiments of the present invention includes a logic unit configured to generate a first signal and a second signal based on or in response to data and a first control signal, a driver including a first PMOS transistor having a first gate, a first source that receives a first voltage from a first voltage source, and a first drain, and a first NMOS transistor having a second gate that receives the second signal, a second source that receives a second voltage from a second voltage source less than the first voltage, and a second drain connected to the first drain, a gate-tracking circuit configured to receive the first signal and transfer the received first signal to the first gate of the first PMOS transistor based on or in response to a second control signal, and an input/output terminal connected to the first drain and the second drain, wherein the gate-tracking circuit includes a transmission gate having an input terminal that receives the first signal, an output terminal connected to the first gate, a negative control terminal, and a positive control terminal that receives the first voltage, and a bias unit configured to provide the second voltage to the negative control terminal based on or in response to the second control signal.

The bias unit may provide the first voltage to a first node based on or in response to the second control signal and a voltage to the input/output terminal, and the first node may be a connection node of the output terminal of the transmission gate and the first gate of the first PMOS transistor.

The bias unit may provide the voltage to the input/output terminal to the negative control terminal of the transmission gate when the voltage to the input/output terminal is greater than the first voltage.

The bias unit may provide the voltage to the input/output terminal to the first node when the voltage to the input/output terminal is greater than the first voltage.

The bias unit may include a first bias unit including a first transistor having a gate that receives the second control signal, and a source and a drain between the negative control terminal of the transmission gate and the second voltage source.

The first bias unit may further include a second transistor having a gate that receives the first voltage, and a source and a drain between the first transistor and the negative control terminal of the transmission gate.

The bias unit may further include a second bias unit, wherein the second bias unit may include a third transistor having a gate that receives the second control signal, and a source and a drain between the first voltage source and a first node, and a fourth transistor having a gate connected to the input/output terminal, and a source and a drain between the third transistor and the first node. The first node may be a connection node of the output terminal of the transmission gate and/or the first gate of the first PMOS transistor.

The bias unit may further include a third bias unit, wherein the third bias unit may include a fifth transistor having a gate that receives the first voltage, and a source and a drain between a second node and the input/output terminal, and a sixth transistor having a gate that receives the first voltage, and a source and a drain between the first node and the input/output terminal. The second node may be a connection node of the first transistor of the first bias unit and/or the negative control terminal of the transmission gate.

The driver may further include a second NMOS transistor having a gate that receives the first voltage, and a source and a drain between the input/output terminal and the first NMOS transistor.

The input/output circuit may further include a floating N-well circuit having a floating node connected to a bulk of the first PMOS transistor of the driver.

The transmission gate may be or comprise a CMOS transmission gate including an NMOS transistor and a PMOS transistor, the positive control terminal may be or comprise a gate of the NMOS transistor of the transmission gate, and the negative control terminal may be or comprise a gate of the PMOS transistor of the transmission gate.

The first transistor may be or comprise an NMOS transistor, and each of the third to sixth transistors may be or comprise a PMOS transistor.

The input/output circuit may further include a floating N-well circuit having a floating node connected to a bulk of the first PMOS transistor of the driver, a bulk of each of the third to sixth transistors, and a bulk of the PMOS transistor of the transmission gate.

The second control signal may be an inverted first control signal.

An input/output circuit according to other embodiments of the present invention includes a logic unit configured to generate a first signal and a second signal based on or in response to data and a first control signal, a driver including a first PMOS transistor having a first gate, a first source that receives a first voltage from a first voltage source, and a first drain, and a first NMOS transistor having a second gate that receives the second signal, a second source that receives a second voltage from a second voltage source less than the first voltage, and a second drain connected to the first drain, a transmission gate having an input terminal receives the first signal, an output terminal connected to the first gate, a negative control terminal, and a positive control terminal that receives the first voltage, a first bias unit including a first transistor configured to provide the second voltage to the negative control terminal based on or in response to a second control signal, a second bias unit including a second transistor and a third transistor between the first voltage source and a first node, the second transistor being controlled by the second control signal, the third transistor being controlled by a voltage to an input/output terminal connected to the first drain and the second drain, and a third bias unit including a fourth transistor between the input/output terminal and the first node and having a gate that receives the first voltage, and a fifth transistor between the input/output terminal and a second node and having a gate that receives the first voltage, wherein the first node is a connection node of the output terminal of the transmission gate and the first gate of the first PMOS transistor, the second node is a connection node of the first bias unit and the negative control terminal of the transmission gate, and the second control signal is an inverted first control signal.

In an output mode, based on or in response to the first and second signals, one of the first PMOS transistor and first NMOS transistor of the driver may be on and the other one may be off, and the first transistor may be on to provide the second voltage to the negative control terminal.

In a reception mode, the first PMOS transistor and first NMOS transistor of the driver may be off, the first transistor of the first bias unit may be off, and the second bias unit may provide the first voltage to the first node.

In the reception mode, the third bias unit may provide the voltage on the input/output terminal to the first node and the second node when the voltage on the input/output terminal is greater than the first voltage.

An electronic device according to an embodiment includes an internal circuit configured to output data and a first control signal, and the above-described input/output circuit.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle(s) of the invention. In the drawings.

DETAILED DESCRIPTION OF THE INVENTION

Figure 1:
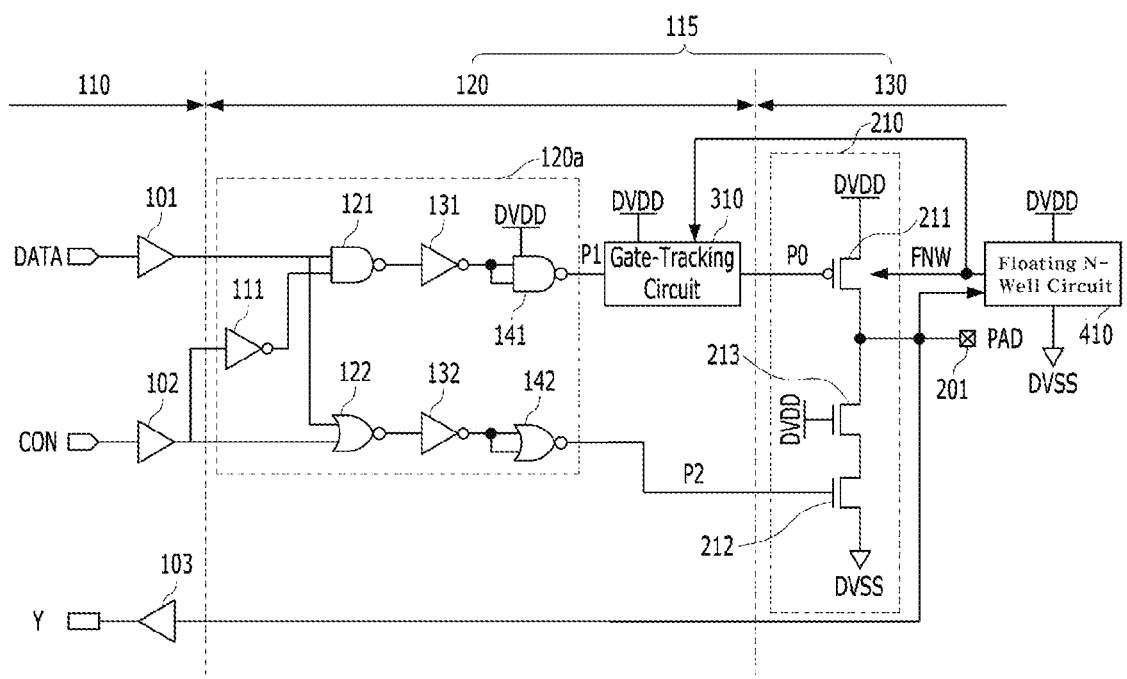
FIG. 1 is a view showing the configuration of an exemplary electronic device according to an embodiment of the present invention.

Reference will now be made in detail to embodiments of the present invention, examples of which are illustrated in the accompanying drawings.

In the following description of various embodiments, it will be understood that, when an element is referred to as being "on" or "under" another element, it can be directly on or under the other element or can be indirectly on or under the other element with one or more intervening elements therebetween. Furthermore, when the expression "on" or "under" is used herein, it may involve not only the upward direction, but also the downward direction, with reference to an element that is on or under another element.

In addition, it will be understood that relative terms used hereinafter such as "first", "second", "on"/"above"/"over" and "under"/"below"/"beneath" may be construed only to distinguish one element from another element without necessarily requiring or involving a certain physical or logical relation or sequence between the elements. In addition, the same reference numerals will be used throughout the drawings to refer to the same or like parts.

The term "float" or "floating" may be used in the detailed description to indicate that a specific part of a circuit is not limited to any specific voltage value.

Figure 2:
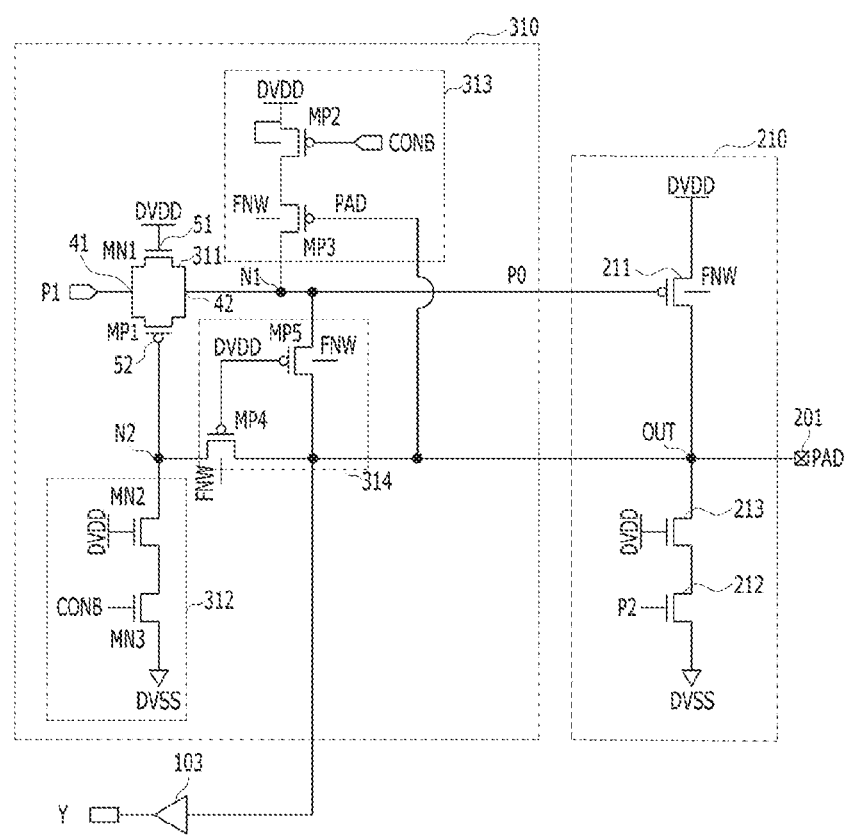
FIG. 2 is a circuit diagram of an embodiment of an exemplary gate-tracking circuit in FIG. 1.

FIG. 1 shows the configuration of an exemplary electronic device according to an embodiment of the present invention, and FIG. 2 is a circuit diagram of an embodiment of an exemplary gate-tracking circuit 310 in FIG. 1.

Referring to FIGS. 1 and 2, the electronic device may include an internal circuit 110 and an input/output circuit 115.

The input/output circuit 115 includes an input/output logic unit 120 and a driver unit 130.

The internal circuit 110 provides data DATA and a first control signal CON to the input/output logic unit 120.

For example, the internal circuit 110 may include a first amplifier or buffer 101 configured to amplify or buffer the data DATA and output (e.g., as a result of amplification or buffering) amplified or buffered data to the input/output logic unit 120, and a second amplifier 102 configured to amplify or buffer the first control signal CON and output (e.g., as a result of amplification or buffering) an amplified or buffered first control signal to the input/output logic unit 120.

The internal circuit 110 may further include a third amplifier or buffer 103 configured to receive a signal Y from the driver unit 130 and amplify or buffer and output the same (e.g., to another circuit in the internal circuit 110).

For example, each of the first to third amplifiers 101 to 103 may be in the form of a level shifter, a buffer, an operational amplifier, a differential amplifier or an inverter, but is not limited thereto.

The input/output logic unit 120 generates first and second signals P1 and P2 configured to control a driver 210 of the driver unit 130 based on and/or in response to the data DATA and the first control signal CON from the internal circuit 110.

The input/output logic unit 120 receives the data DATA and the first control signal CON from the internal circuit 110, may perform a logic operation on the received DATA and/or first control signal CON, and provides one or more driver signals (e.g., as a result of the logic operation) to the driver unit 130.

For example, the input/output logic unit 120 may perform the logic operation with respect to the data DATA and the first control signal CON, and generate a first signal P1 and a second signal P2 (e.g., based on the result of the logic operation).

The input/output logic unit 120 may include a logic unit 120a and a gate-tracking circuit 310.

The logic unit 120a may perform the logic operation with respect to the data DATA and the first control signal CON and output the first signal P1 and the second signal P2 (e.g., based on the result of the logic operation).

Here, the first signal P1 may be a signal that turns on or turns off a PMOS transistor 211, and the second signal P2 may be a signal that turns on or turns off an NMOS transistor 212.

The first signal P1 and the second signal P2 may be generated based on or as a result of the logic operation on the data DATA and the first control signal CON, and the driver 210 may operate in an output mode or a reception mode.

The logic unit 120a may include a first inverter 111, a first NAND gate 121, and a first NOR gate 122.

The first inverter 111 inverts the first control signal CON and outputs an inverted control signal.

The first NAND gate 121 performs a logic (e.g., NAND) operation on the data DATA and the inverted control signal output from the first inverter 111, and outputs a first logic signal based on or as a result of the logic (e.g., NAND) operation.

The first NOR gate 122 performs a logic (e.g., NOR) operation on the data DATA and the first control signal CON, and outputs a second logic signal based on or as a result of the logic (e.g., NOR) operation.

The logic unit 120a may further include a second inverter 131 and a third inverter 132.

The second inverter 131 may invert the first logic signal and output an inverted first logic signal (e.g., as a result of inversion).

The third inverter 132 may invert the second logic signal and output an inverted second logic signal (e.g., as a result of the inversion).

The logic unit 120a may further include a second NAND gate 141 and a second NOR gate 142.

The second NAND gate 141 has first and second input terminals, and performs a logic (e.g., NAND) operation on the inverted first logic signal output from the second inverter 131 (which is input to each of the first and second input terminals of the second NAND gate 141), and generates the first signal P1 based on or as a result of the logic (e.g., NAND) operation. For example, the first and second input terminals of the second NAND gate 141 may be connected to each other.

The second NOR gate 142 has third and fourth input terminals, and performs a logic (e.g., NOR) operation on the inverted second logic signal output from the third inverter 132 which is input to each of the third and fourth input terminals) and generates the second signal P2 based on or as a result of the logic (e.g., NOR) operation. For example, the third and fourth input terminals of the second NOR gate 142 may be connected to each other.

The second NAND gate 141 and the second NOR gate 142 may be omitted from the logic unit 120a in FIG. 1.

The driver unit 130 includes an input/output terminal 201, the driver 210, and a floating N-well circuit 410. Here, the input/output terminal 201 may be substituted with an input/output pad PAD.

The driver 210 has an output node OUT (e.g., see FIG. 2), and outputs a first voltage (for example, 3.3V) DVDD from a first voltage source or a second voltage (for example, 0V) DVSS from a second voltage source at the output node OUT based on or in response to an output P0 of the gate-tracking circuit 310 and the second signal P2. The output node OUT is connected to the input/output terminal 201. For example, the first voltage DVDD from the first voltage source may be greater than the second voltage DVSS from the second voltage source (DVDD>DVSS).

The driver 210 may perform a pull-up or pull-down operation in response to the output P0 of the gate-tracking circuit 310 and the second signal P2 and output the first voltage (for example, 3.3V) DVDD, which is a pull-up voltage, or the second voltage (for example, 0V) DVSS, which is a pull-down voltage, through the output node OUT.

For example, the first voltage DVDD from the first voltage source may be a voltage capable of turning on an NMOS transistor, for example, 3.3V, and the second voltage DVSS from the second voltage source may be a voltage capable of turning on a PMOS transistor, for example, 0V.

The driver 210 may include the PMOS transistor 211 and the first NMOS transistor 212. The driver 210 may further include a second NMOS transistor 213.

The PMOS transistor 211 may have a gate that receives the output P0 from the gate-tracking circuit 310, a source that receives the first voltage DVDD from the first voltage source, and a drain connected to the input/output terminal 201.

The first NMOS transistor 212 may have a gate that receives the second signal P2, a source that receives the second voltage DVSS from the second voltage source, and (in the absence of the transistor 213) a drain connected to the input/output terminal 201 and the drain of the PMOS transistor 211.

The second NMOS transistor 213 may have a gate that receives the first voltage DVDD, and a source and a drain between the input/output terminal 201 and the first NMOS transistor 212. Thus, the second NMOS transistor 213 may always be on, may function as a resistor, or may be absent from the driver 210.

The input/output terminal 201 may be connected to the drain of the PMOS transistor 211 and the source of the second NMOS transistor 213.

For example, a connection node of the drain of the PMOS transistor 211 and the source of the second NMOS transistor 213 may be the output node OUT of the driver 210, which may be connected to the input/output terminal 201.

The second NMOS transistor 213 may protect the first NMOS transistor 212 by preventing a voltage greater than the first voltage DVDD (which may be the maximum voltage tolerable by the first NMOS transistor 212) from being applied to the first NMOS transistor 212.

The second NMOS transistor 213 may be omitted in FIG. 2. In the case where the second NMOS transistor 213 is omitted, the input/output terminal 201 may be connected to the drain of the PMOS transistor 211 and the drain of the first NMOS transistor 212, and the output node OUT of the driver 210 may be a connection node of the drain of the PMOS transistor 211 and the drain of the first NMOS transistor 212.

The gate-tracking circuit 310 may be controlled by a voltage at or on a floating N-well and/or floating node FNW. The gate-tracking circuit 310 may transfer the first signal P1 (output by the logic unit 120a) to, or block the first signal P1 from, the gate of the PMOS transistor 211 of the driver 210.

The gate-tracking circuit 310 may include a transmission gate 311 and a bias unit, as shown in FIG. 2.

For example, the bias unit of the gate-tracking circuit 310 may include a first bias unit 312 and a second bias unit 313.

The transmission gate 311 transfers the first signal P1 to the gate of the PMOS transistor 211 in the driver 210. The transmission gate 311 may be controlled at least in part by the first voltage DVDD and in part by the first bias unit 312.

For example, the transmission gate 311 may transfer or block the first signal P1 to the gate of the PMOS transistor 211 of the driver 210 based on or in response to the first voltage DVDD and a second control signal CONB.

The transmission gate 311 may have an input terminal 41, an output terminal 42, a positive control terminal 51, and a negative control terminal 52.

The first signal P1 may be provided to the input terminal 41 of the transmission gate 311. The output terminal 42 of the transmission gate 311 may be connected to the gate of the PMOS transistor 211 of the driver 210.

The first voltage DVDD may be provided to the positive control terminal 51 of the transmission gate 311, and the first bias unit 312 may be connected to the negative control terminal 52 of the transmission gate 311.

For example, the transmission gate 311 may be a CMOS transmission gate including an NMOS transistor MN1 and a PMOS transistor MP1. The positive control terminal 51 may be a gate of the NMOS transistor MN1, and the negative control terminal 52 may be a gate of the PMOS transistor MP1.

The first bias unit 312 may provide the second voltage DVSS to the negative control terminal 52 of the transmission gate 311 based on or in response to the second control signal CONB. For example, the second control signal CONB may be an inverted first control signal CON, but is not limited thereto.

For example, the first bias unit 312 may include a transistor MN3 having a gate that receives the second control signal CONB, and a source and a drain between the negative control terminal 52 of the transmission gate 311 and the second voltage source. For example, the second voltage DVSS may be provided to the source of the transistor MN3.

For example, the first bias unit 312 may further include a transistor MN2 having a gate that receives the first voltage DVDD, and a source and a drain between the transistor MN3 and the negative control terminal 52 of the transmission gate 311. For example, the source of the transistor MN2 may be connected to a second node N2, and the drain of the transistor MN2 may be connected to the drain of the transistor MN3.

The transistor MN2 may protect the transistor MN3 by preventing a voltage greater than the first voltage DVDD (which may be the maximum voltage tolerable by the transistor MN3) from being applied to the transistor MN3.

Each of the transistors MN2 and MN3 of the first bias unit 312 may be an NMOS transistor, but is not limited thereto. In another embodiment, at least one of the transistors MN2 and MN3 of the first bias unit 312 may be a PMOS transistor. However, if the transistor MN2 is a PMOS transistor, it may receive a ground voltage (e.g., the voltage DVSS) at its gate, and if the transistor MN3 is a PMOS transistor, it may receive the first control signal CON at its gate.

The second bias unit 313 may provide the first voltage DVDD to a first node N1 based on or in response to the second control signal CONB and a voltage at the input/output terminal 201. The first node N1 may be a connection node of the output terminal 42 of the transmission gate 311 and the gate of the PMOS transistor 211 of the driver 210.

For example, the second bias unit 313 may include a transistor MP2 and a transistor MP3 between the first voltage source and the first node N1.

The transistor MP2 may be controlled by the second control signal CONB, and the transistor MP3 may be controlled by the voltage at the input/output terminal 201.

The transistor MP2 may have a gate that receives the second control signal CONB, and a source and a drain between the first voltage source and the first node N1. For example, the first voltage DVDD from the first voltage source may be provided to the source of the transistor MP2.

For example, the source of the transistor MP2 and the bulk of the transistor MP2 may be connected to each other. In another embodiment, for example, the floating N-well and/or floating node of the floating N-well circuit 410 may be connected to the bulk of the transistor MP2.

The transistor MP3 may have a gate connected to the input/output terminal 201, and a source and a drain between the transistor MP2 and the first node N1.

For example, the drain of the transistor MP3 may be connected to the drain of the transistor MP2, and the source of the transistor MP3 may be connected to the first node N1.

Each of the transistors MP2 and MP3 of the second bias unit 313 may be a PMOS transistor, but is not limited thereto. In another embodiment, at least one of the transistors MP2 and MP3 of the second bias unit 313 may be an NMOS transistor. However, if the transistor MP2 is an NMOS transistor, it may receive the first control signal CON at its gate, and if the transistor MP3 is an NMOS transistor, it may receive an inverted output signal at its gate.

The bias unit of the gate-tracking circuit 310 may further include a third bias unit 314.

The third bias unit 314 may include a transistor MP5 between the input/output terminal 201 and the first node N1, and a transistor MP4 between the input/output terminal 201 and the second node N2.

The transistor MP4 may have a gate that receives the first voltage DVDD, and a source and a drain between the second node N2 and the input/output terminal 201.

For example, the drain of the transistor MP4 may be connected to the second node N2, and the source of the transistor MP4 may be connected to the input/output terminal 201.

The second node N2 may be a connection node of the first bias unit 312 and the negative control terminal 52 of the transmission gate 311.

For example, the second node N2 may be a connection node of the transistor MN2 of the first bias unit 312 and the negative control terminal 52 of the transmission gate 311.

The transistor MN2 may be omitted in the first bias unit 312 in FIG. 2. In the case where the transistor MN2 is omitted, the second node N2 may be a connection node of the transistor MN3 and the negative control terminal 52 of the transmission gate 311.

The transistor MP5 may have a gate that receives the first voltage DVDD, and a source and a drain between the first node N1 and the input/output terminal 201. For example, the gate of the transistor MP4 and the gate of the transistor MP5 may be connected to each other, the drain of the transistor MP5 may be connected to the first node N1, and the source of the transistor MP5 may be connected to the input/output terminal 201.

The floating N-well circuit 410 has a floating node connected to a bulk (or body) or a bulk node (or body node) of the PMOS transistor 211 of the driver 210.

For example, the floating node may be the floating N-well and/or floating node FNW. Here, the bulk of the transistor may be the bulk node of the transistor, and the body of the transistor may be the body node of the transistor.

In addition, the floating node (for example, FNW) may be coupled or connected to bulks of PMOS transistors of elements constituting the gate-tracking circuit 310.

For example, the floating N-well and/or floating node FNW may be coupled or connected to a bulk node of at least one of the PMOS transistor MP1 of the transmission gate 311, the PMOS transistors MP2 and/or MP3 of the second bias unit 313, and the PMOS transistors MP4 and MP5 of the third bias unit 314.

The input/output terminal 201 may be connected to the connection node OUT of the drain of the PMOS transistor 211 and the drain of the NMOS transistor 212.

The floating N-well and/or floating node FNW may be connected to a bulk node of at least one of elements constituting the input/output logic unit 120, for example, the PMOS transistors included in the gate-tracking circuit 310.

The input/output circuit 115 may operate in the output mode or the reception mode.

The output mode of the input/output circuit 115 is a mode configured to output the data DATA through the input/output terminal 201. The reception mode of the input/output circuit 115 is a mode configured to receive the signal Y input through the input/output terminal 201 (e.g., received at the input/output terminal 201 from an external circuit or signal line) and transferred to the internal circuit 110.

The output mode and the reception mode may be determined based on or in response to the first control signal CON.

For example, when the voltage of the first control signal CON has a first level (for example, a low binary logic level), the input/output circuit 115 may operate in the output mode and output data to the input/output terminal 201. For example, when the voltage of the first control signal CON is the second voltage DVSS, the input/output circuit 115 may operate in the output mode.

In contrast, when the voltage of the first control signal CON has a second level (for example, a high binary logic level) greater than the first level, the input/output circuit 115 may operate in the reception mode and receive data (e.g., from an external circuit or signal line) through the input/output terminal 201. For example, when the voltage of the first control signal CON is the first voltage DVDD, the input/output circuit 115 may operate in the reception mode.

First, the output mode of the input/output circuit 115 will be described.

In the output mode, the floating N-well circuit 410 may disconnect or decouple the floating N-well and/or floating node FNW from the input/output terminal 201 and/or provide the first voltage DVDD from the first voltage source to the floating N-well and/or floating node FNW.

In the output mode, because the voltage at the floating N-well and/or floating node FNW is the first voltage DVDD from the first voltage source, the bulk node of the PMOS transistor 211 of the driver 210 may be biased by the first voltage DVDD from the first voltage source.

In the output mode, in response to the first signal P1 and second signal P2 from the logic unit 120a (generated based on or in response to the first control signal CON and the data DATA), one of the PMOS transistor 211 and NMOS transistor 212 of the driver 210 may be on and the other one may be off.

For example, when the data DATA has a low binary logic level, each of the first and second signals P1 and P2 may have a high binary logic level, the PMOS transistor 211 of the driver 210 may be off, the NMOS transistor 212 of the driver 210 may be on, and the voltage at the input/output terminal 210 may be the second voltage DVSS.

In contrast, for example, when the data DATA has a high binary logic level, each of the first and second signals P1 and P2 may have a low binary logic level, the PMOS transistor 211 of the driver 210 may be on, the NMOS transistor 212 of the driver 210 may be off, and the voltage at the input/output terminal 210 may be the first voltage DVDD.

In the output mode, the voltage of the second control signal CONB may have the second level (for example, DVDD or a high binary logic level), and the transmission gate 311 may function to transfer the signal input to the input terminal 41 to the output terminal 42.

A description will hereinafter be given of the operation of the bias unit of the gate-tracking circuit 310 in the output mode.

In the output mode, the transistor MN3 of the first bias unit 312 may be on in response to the second control signal CONB, the second voltage DVSS may be provided to the negative control terminal 52 of the transmission gate 311, and the transistor MP1 of the transmission gate 311 may be turned on.

That is, the first signal P1 input to the input terminal 41 of the transmission gate 311 may be output through the output terminal 42 of the transmission gate 311, and the output P0 from the transmission gate 311 may be transferred to the gate of the PMOS transistor 211 of the driver 210.

Namely, in the output mode, the gate of the PMOS transistor 211 of the driver 210 may be controlled by the transferred first signal P1 (or output P0), and the gate of the NMOS transistor 212 of the driver 210 may be controlled by the second signal P2.

In the output mode, the transistor MP2 of the second bias unit 313 may be turned off by the second control signal CONB (e.g., when the second control signal CONB has a low logic level), and the second bias unit 313 may not operate.

In the output mode, the transistors MP4 and MP5 of the third bias unit 314 may be turned off, and the third bias unit 314 may not operate.

Next, the reception mode of the input/output circuit 115 will be described.

In the reception mode, the PMOS transistor 211 and NMOS transistor 212 of the driver 210 may be turned off by the first signal P1 and second signal P2 from the logic unit 120a, based on or in response to the first control signal CON and the data DATA.

For example, in the reception mode, the first control signal CON may have a high binary logic level, the first signal P1 generated by the logic unit 120a may have a high binary logic level, the second signal P2 generated by the logic unit 120a may have a low binary logic level, and the PMOS transistor 211 and NMOS transistor 212 of the driver 210 may be turned off.

In the reception mode, when the voltage of the signal input to the input/output terminal 201 is less than or equal to the first voltage DVDD from the first voltage source, the floating N-well circuit 410 may maintain the voltage at or on the floating N-well and/or floating node FNW at the first voltage DVDD, thereby preventing leakage current from flowing from the input/output terminal 201 to the bulk of the PMOS transistor 211 or the bulk of the NMOS transistor 212 of the driver 210.

A description will hereinafter be given of the operation of the bias unit of the gate-tracking circuit 310 in the reception mode.

In the reception mode, the transistor MN3 of the first bias unit 312 may be turned off by the second control signal CONB when it has a first binary logic level (for example, DVSS).

In the reception mode, the transistor MP2 of the second bias unit 313 may be turned on by the second control signal CONB.

In the reception mode, the second bias unit 313 may provide the first voltage DVDD to the first node N1 based on or in response to the voltage of the signal input to the input/output terminal 201.

In addition, in the reception mode, the third bias unit 314 may provide the voltage of the signal input to the input/output terminal 201 to each of the first node N1 and second node N2 based on or in response to the voltage of the signal input to the input/output terminal 201.

For example, in the reception mode, when the voltage of the signal input (e.g., from an external circuit or signal line) to the input/output terminal 201 is less than or equal to the first voltage DVDD and the voltage at the input/output terminal 201 is DVSS (0V), the transistor MP3 of the second bias unit 313 may be turned on, the first voltage DVDD may be provided to the first node N1, and the PMOS transistor 211 of the driver 210 may be turned off.

Alternatively, for example, in the reception mode, when the voltage of the signal input to the input/output terminal 201 is less than or equal to the first voltage DVDD, the transistors MP4 and MP5 of the third bias unit 314 may be turned off, and the first and second nodes N1 and N2 may be disconnected from the input/output terminal 201.

The reception mode of the driver 130 may include a tolerant mode. The tolerant mode represents an interface operation where a signal having a voltage greater than the first voltage DVDD is received through the input/output terminal 201.

Through the tolerant mode, the input/output circuit 115 can perform the interface operation in a high input voltage range, so as to be able to communicate with a wide variety of other products or circuits.

In the tolerant mode, a third voltage (for example, 5V) greater than the first voltage (for example, 3.3V) DVDD may be applied to the input/output terminal 201 (e.g., from the external circuit or signal line). Because the tolerant mode is basically the reception mode, the voltage of the first control signal CON may have the second level (e.g., a high binary logic level or DVDD), and the voltage of the second control signal CONB may have the first level (e.g., a low binary logic level or DVSS).

In the tolerant mode in which the third voltage (for example, 5V) is at or on the input/output terminal 201, the floating N-well circuit 410 may maintain the voltage at or on the floating N-well and/or floating node FNW at the voltage on the input/output terminal 201, namely, the third voltage (for example, 5V).

A description will hereinafter be given of the operation of the bias unit of the gate-tracking circuit 310 in the tolerant mode.

In the tolerant mode, the operations of the first bias unit 312 and second bias unit 313 may be performed as described in the reception mode.

In the tolerant mode in which the voltage at the input/output terminal 201 is greater than the first voltage DVDD, each of the transistors MP4 and MP5 of the third bias unit 314 may be turned on.

When the transistor MP4 of the third bias unit 314 is on, the voltage at the input/output terminal 201 may be provided to the negative control terminal 52 of the transmission gate 311, and the PMOS transistor MP1 of the transmission gate 311 may be off.

In addition, when the transistor MP5 of the third bias unit 314 is on, the voltage at the input/output terminal 201 may be provided to the first node N1, but the NMOS transistor MN1 of the transmission gate 311 and the PMOS transistor 211 of the driver 210 may be off.

That is, in the tolerant mode, because the input terminal 41 of the transmission gate 311 is effectively disconnected from the first node N1 by the operation of the third bias unit 314, and the first voltage source and the second voltage source are disconnected from the first node N1 by the operations of the first and second bias units 312 and 313, a leakage path between the input/output terminal 201 and the first voltage source (or second voltage source) may be blocked, and leakage current therebetween may be prevented, even though the voltage at the first node N1 rises to the voltage on the input/output terminal 201.

In addition, in the tolerant mode, because the transmission gate 311 is off, the elements of the logic unit 120a may be disconnected from the first node N1. As a result, according to embodiments of the invention, in the tolerant mode, the elements of the logic unit 120a may be protected, and a signal having a voltage greater than or equal to breakdown voltages of the elements (for example, transistors) of the logic unit 120a may be received through the input/output terminal 201.

The reception mode of the driver 130 may include a fail-safe mode. The fail-safe mode is a mode configured to shut down power on or to a chip (e.g., containing the present input/output circuit) that does not need to operate, in order to reduce power consumption. In the fail-safe mode, the first voltage DVDD from the first voltage source and the second voltage DVSS from the second voltage source may be 0V.

Figure 3:
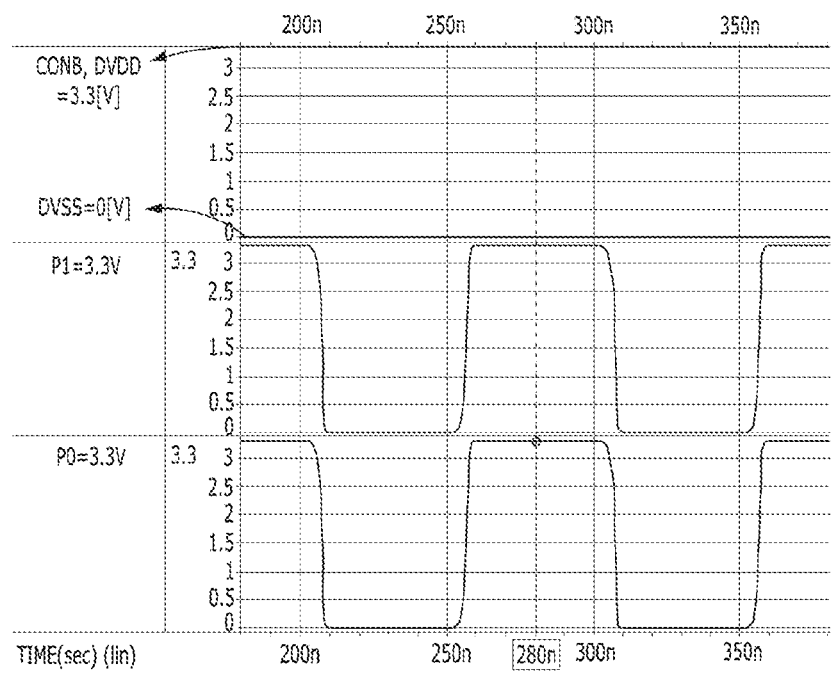
FIG. 3 is a waveform diagram illustrating a simulation result of an output of the exemplary gate-tracking circuit in an output mode of the electronic device of FIG. 1.

FIG. 3 is a waveform diagram illustrating a simulation result of the output of the exemplary gate-tracking circuit 310 in the output mode of the electronic device of FIG. 1.

Referring to FIG. 3, in the output mode, the second control signal CONB may have the second level (for example, DVDD, or 3.3V), and the gate-tracking circuit 310 may receive the first signal P1 and output the output P0 to the gate of the PMOS transistor 211 of the driver 210.

Figure 4:
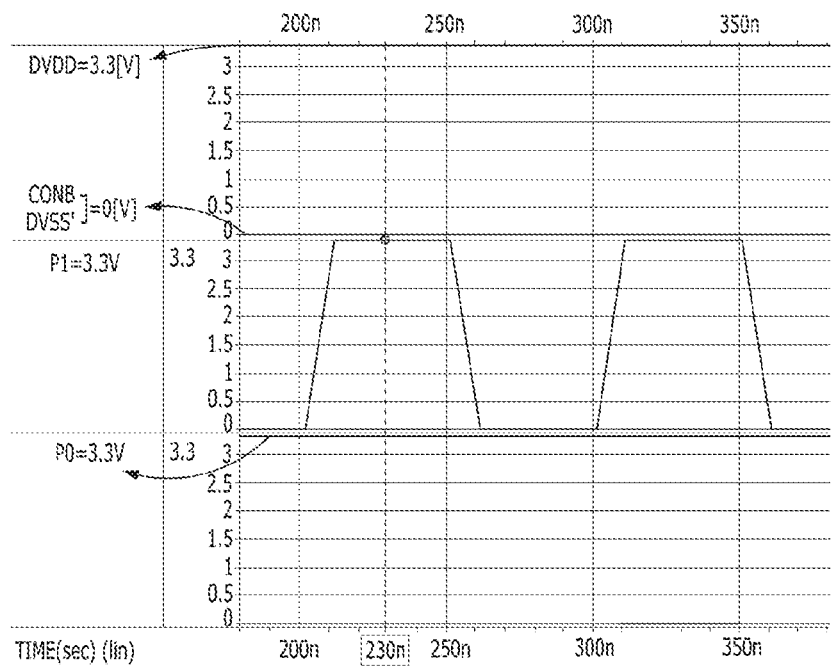
FIG. 4 is a waveform diagram illustrating a simulation result of the output of the exemplary gate-tracking circuit in a reception mode of the electronic device of FIG. 1.

FIG. 4 is a waveform diagram illustrating a simulation result of the output of the exemplary gate-tracking circuit 310 in the reception mode of the electronic device of FIG. 1.

Referring to FIG. 4, in the reception mode, the second control signal CONB may have the first level (for example, DVSS or 0V), and the transistor MP2 of the second bias unit 313 may be on. When the signal input to the input/output terminal 201 is less than or equal to the first voltage DVDD, the transistor MP3 of the second bias unit 313 may be on, thereby causing the first voltage DVDD to be provided as the voltage at the first node N1. As a result, the output P0 of the gate-tracking circuit 310 may be maintained at the first voltage DVDD, thereby causing the reception mode to be maintained.

Figure 5:
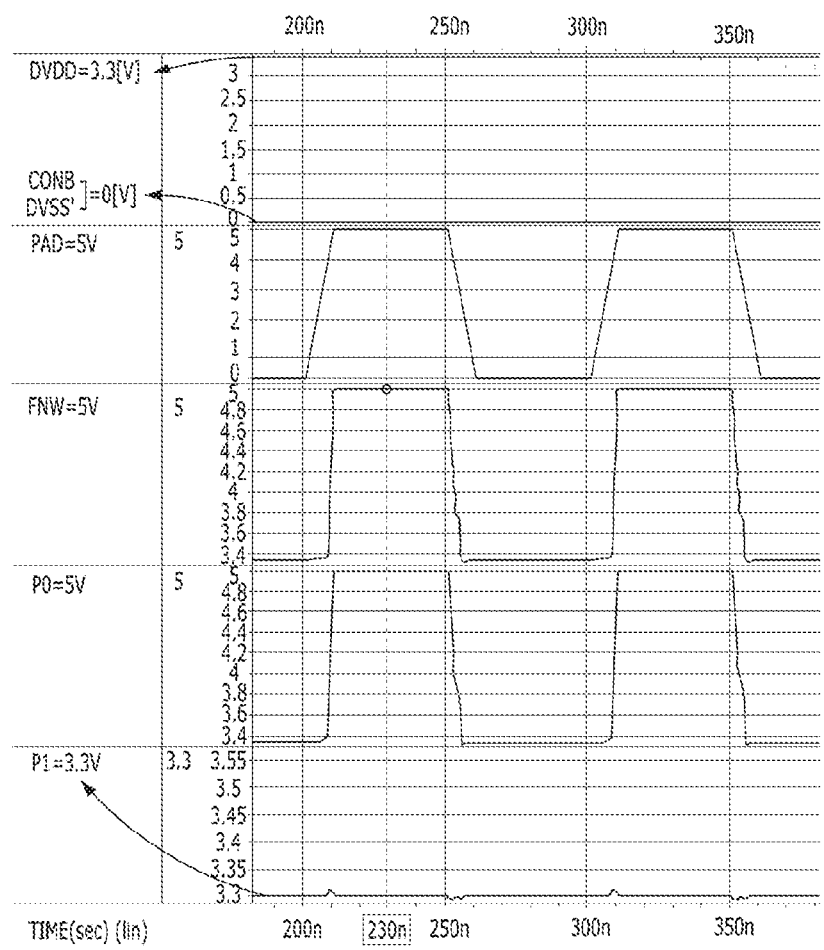
FIG. 5 is a waveform diagram illustrating a simulation result of the output of the exemplary gate-tracking circuit in a tolerant mode of the electronic device of FIG. 1.

FIG. 5 is a waveform diagram illustrating a simulation result of the output of the exemplary gate-tracking circuit 310 in the tolerant mode.

Referring to FIG. 5, in the tolerant mode, the voltage at the input/output terminal 201 may be provided as the voltage at or on the floating N-well and/or floating node FNW.

In addition, in the tolerant mode, the voltage at the input/output terminal 201 may be provided as the output P0 of the gate-tracking circuit 310, thereby preventing current leakage through the PMOS transistor of the driver 210.

In addition, in the tolerant mode, because the transmission gate 311 is off, the logic unit 120a may be disconnected from the first node N1, thereby protecting the elements of the logic unit 120a from the voltage at the input/output terminal 201.

Figure 6:
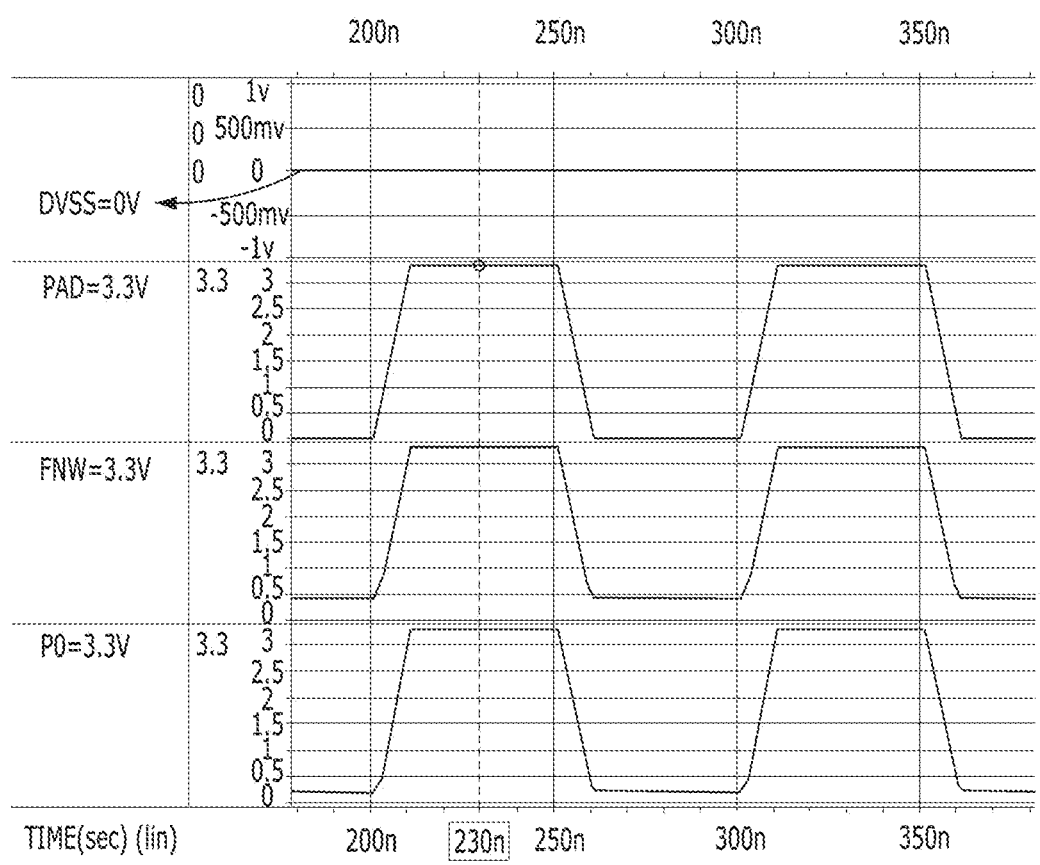
FIG. 6 is a waveform diagram illustrating a simulation result of the output of the exemplary gate-tracking circuit in a fail-safe mode of the electronic device of FIG. 1.

FIG. 6 is a waveform diagram illustrating a simulation result of the output of the exemplary gate-tracking circuit 310 in the fail-safe mode of the electronic device of FIG. 1.

Referring to FIG. 6, when the voltage at the input/output terminal 201 rises, the gate voltage of the PMOS transistor 211 of the driver 210 may also rise, thereby preventing current leakage.

As described above, according to embodiments, it may be possible to receive a signal having a voltage greater than or equal to the breakdown voltage of the elements of the logic unit 120a through the input/output terminal 201 and prevent current leakage when a voltage greater than an operating voltage of the electronic device is applied to the input/output terminal 201. Further, it may be possible to receive a signal through the input/output terminal 201 in a wider voltage range.

As is apparent from the above description, according to embodiments of the invention, it may be possible to receive a signal having a voltage greater than or equal to a breakdown voltage of an element of a logic unit through an input/output terminal and, when a voltage greater than an operating voltage is applied to the input/output terminal, prevent current leakage and protect the elements of the logic unit.

The embodiments as described above may include particular features, structures, or characteristics, but not every embodiment necessarily includes the particular features, structures, or characteristics. Furthermore, the particular features, structures or characteristics in each embodiment may be combined in any suitable manner, as would be apparent to one of ordinary skill in the art from this disclosure, in one or more embodiments. Therefore, combinations of features of different embodiments are meant to be within the scope of the invention.

What is claimed is:

1. An input/output circuit comprising:
    a logic unit configured to generate a first signal and a second signal based on or in response to data and a first control signal;
    a driver comprising a first PMOS transistor having a first gate, a first source that receives a first voltage from a first voltage source, and a first drain, and a first NMOS transistor having a second gate that receives the second signal, a second source that receives a second voltage from a second voltage source less than the first voltage, and a second drain connected to the first drain;
    a gate-tracking circuit configured to receive the first signal and transfer the received first signal to the first gate of the first PMOS transistor based on or in response to a second control signal; and
    an input/output terminal connected to the first drain and the second drain,
    wherein the gate-tracking circuit comprises:
    a transmission gate having an input terminal that receives the first signal, an output terminal connected to the first gate, a negative control terminal, and a positive control terminal that receives the first voltage; and
    a bias unit configured to provide the second voltage to the negative control terminal based on or in response to the second control signal, wherein:
        the bias unit provides the first voltage to a first node based on or in response to the second control signal and a voltage to the input/output terminal, and
        the first node is a connection node of the output terminal of the transmission gate and the first gate of the first PMOS transistor.

2. The input/output circuit according to claim 1, wherein the bias unit provides the voltage to the input/output terminal to the negative control terminal of the transmission gate when the voltage to the input/output terminal is greater than the first voltage.

3. The input/output circuit according to claim 2, wherein the bias unit provides the voltage to the input/output terminal to the first node when the voltage to the input/output terminal is greater than the first voltage.

4. The input/output circuit according to claim 1, wherein the bias unit comprises a first bias unit comprising a first transistor having a gate that receives the second control signal, and a source and a drain between the negative control terminal of the transmission gate and the second voltage source.

5. The input/output circuit according to claim 4, wherein the first bias unit further comprises a second transistor having a gate that receives the first voltage, and a source and a drain between the first transistor and the negative control terminal of the transmission gate.

6. The input/output circuit according to claim 4, wherein the bias unit further comprises a second bias unit,
    wherein the second bias unit comprises:
        a third transistor having a gate that receives the second control signal, and a source and a drain between the first voltage source and a first node; and
        a fourth transistor having a gate connected to the input/output terminal, and a source and a drain between the third transistor and the first node,
        wherein the first node is a connection node of the output terminal of the transmission gate and/or the first gate of the first PMOS transistor.

7. The input/output circuit according to claim 6, wherein the bias unit further comprises a third bias unit,
wherein the third bias unit comprises:
a fifth transistor having a gate that receives the first voltage, and a source and a drain between a second node and the input/output terminal; and
a sixth transistor having a gate that receives the first voltage, and a source and a drain between the first node and the input/output terminal,
wherein the second node is a connection node of the first transistor of the first bias unit and/or the negative control terminal of the transmission gate.

8. The input/output circuit according to claim 1, wherein the driver further comprises a second NMOS transistor having a gate that receives the first voltage, and a source and a drain between the input/output terminal and the first NMOS transistor.

9. The input/output circuit according to claim 1, further comprising a floating N-well circuit having a floating node connected to a bulk of the first PMOS transistor of the driver.

10. The input/output circuit according to claim 7, wherein the transmission gate comprises a CMOS transmission gate comprising an NMOS transistor and a PMOS transistor,
wherein the positive control terminal comprises a gate of the NMOS transistor of the transmission gate, and the negative control terminal comprises a gate of the PMOS transistor of the transmission gate.

11. The input/output circuit according to claim 10, wherein the first transistor comprises an NMOS transistor, and each of the third to sixth transistors comprises a PMOS transistor.

12. The input/output circuit according to claim 11, further comprising a floating N-well circuit having a floating node connected to a bulk of the first PMOS transistor of the driver, a bulk of each of the third to sixth transistors, and/or a bulk of the PMOS transistor of the transmission gate.

13. The input/output circuit according to claim 1, wherein the second control signal is an inverted first control signal.

14. An input/output circuit comprising:
a logic unit configured to generate a first signal and a second signal based on or in response to data and a first control signal;
a driver comprising a first PMOS transistor having a first gate, a first source that receives a first voltage from a first voltage source, and a first drain, and a first NMOS transistor having a second gate that receives the second signal, a second source that receives a second voltage from a second voltage source less than the first voltage, and a second drain connected to the first drain;
a transmission gate having an input terminal that receives the first signal, an output terminal connected to the first gate, a negative control terminal, and a positive control terminal that receives the first voltage;
a first bias unit comprising a first transistor configured to provide the second voltage to the negative control terminal based on or in response to a second control signal;
a second bias unit comprising a second transistor and a third transistor between the first voltage source and a first node, the second transistor being controlled by the second control signal, the third transistor being controlled by a voltage to an input/output terminal;
the input/output terminal, connected to the first drain and the second drain; and
a third bias unit comprising a fourth transistor between the input/output terminal and the first node and having a gate that receives the first voltage, and a fifth transistor between the input/output terminal and a second node and having a gate that receives the first voltage,
wherein the first node is a connection node of the output terminal of the transmission gate and the first gate of the first PMOS transistor, the second node is a connection node of the first bias unit and the negative control terminal of the transmission gate, and the second control signal is an inverted first control signal.

15. The input/output circuit according to claim 14, wherein, in an output mode, based on or in response to the first and second signals, one of the first PMOS transistor and first NMOS transistor of the driver is on and the other one is off, and
in the output node, the first transistor is on to provide the second voltage to the negative control terminal.

16. The input/output circuit according to claim 14, wherein, in a reception mode, the first PMOS transistor and first NMOS transistor of the driver are off, the first transistor of the first bias unit is off, and the second bias unit provides the first voltage to the first node.

17. The input/output circuit according to claim 16, wherein, in the reception mode, the third bias unit provides the voltage on the input/output terminal to the first node and the second node when the voltage on the input/output terminal is greater than the first voltage.

18. An electronic device comprising:
an internal circuit configured to output data and a first control signal; and
the input/output circuit according to claim 1.

* * * * *